(12) United States Patent
Conway

(10) Patent No.: US 6,736,654 B2
(45) Date of Patent: May 18, 2004

(54) HOLD DOWN APPARATUS FOR PERPENDICULARLY MOUNTED CARDS

(75) Inventor: Ralph W. Conway, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/268,267

(22) Filed: Oct. 9, 2002

(65) Prior Publication Data

US 2004/0072457 A1 Apr. 15, 2004

(51) Int. Cl.[7] ............................. F16B 45/00; H01R 13/62
(52) U.S. Cl. ........................................ 439/153; 248/71
(58) Field of Search .................................. 439/153, 155, 439/504, 529, 319; 411/61; 248/71

(56) References Cited

U.S. PATENT DOCUMENTS

| | | | | |
|---|---|---|---|---|
| 4,449,772 A | * | 5/1984 | Johnson, III | 439/504 |
| 4,936,409 A | * | 6/1990 | Nix et al. | 180/68.5 |
| 6,398,169 B1 | * | 6/2002 | Streit | 248/71 |
| 6,401,923 B1 | * | 6/2002 | Huang | 206/376 |

\* cited by examiner

Primary Examiner—Chandrika Prasad

(57) ABSTRACT

A hold down apparatus is disclosed that has a saw-toothed device with a double end and a single end, the double end adapted to encompass a perpendicularly mounted card. The hold down apparatus has an anchoring hole in a supporting structure and a barbed hook coupled to the saw-toothed device and adapted to couple the saw-toothed device to the supporting structure through the anchoring hole, wherein the barbed hook deploys from the single end of the saw-toothed device. The hold down apparatus also has a crossbar adapted to couple to the double end of the device, wherein the crossbar binds the perpendicularly mounted card securely in place.

23 Claims, 4 Drawing Sheets

FIG._1a
(PRIOR ART)
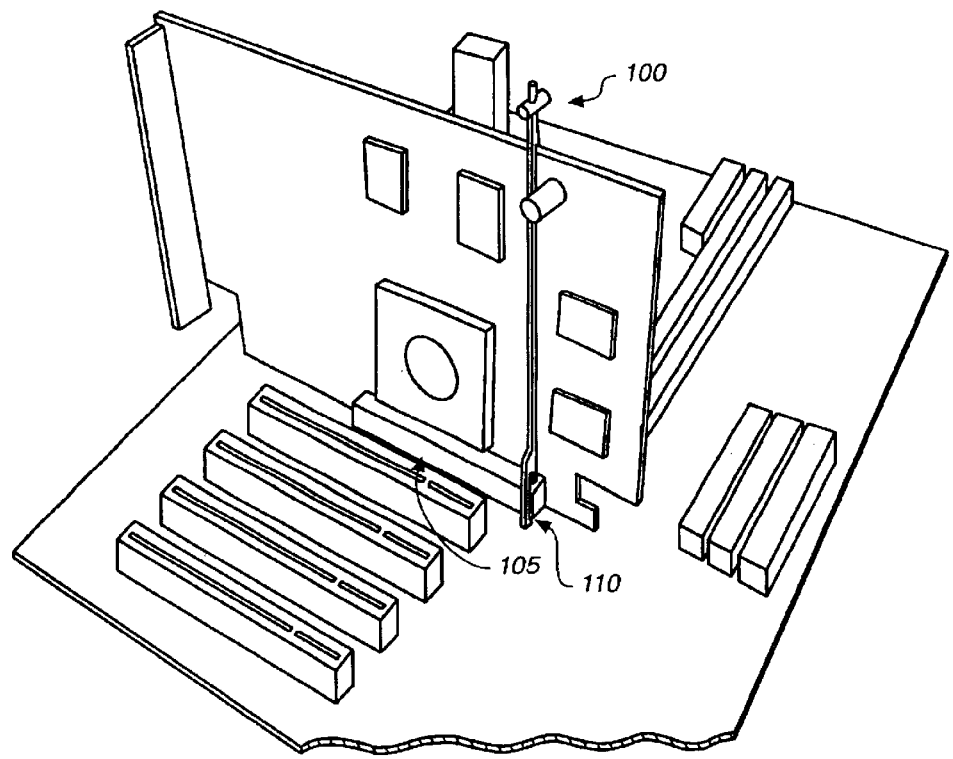
FIG._1b
(PRIOR ART)

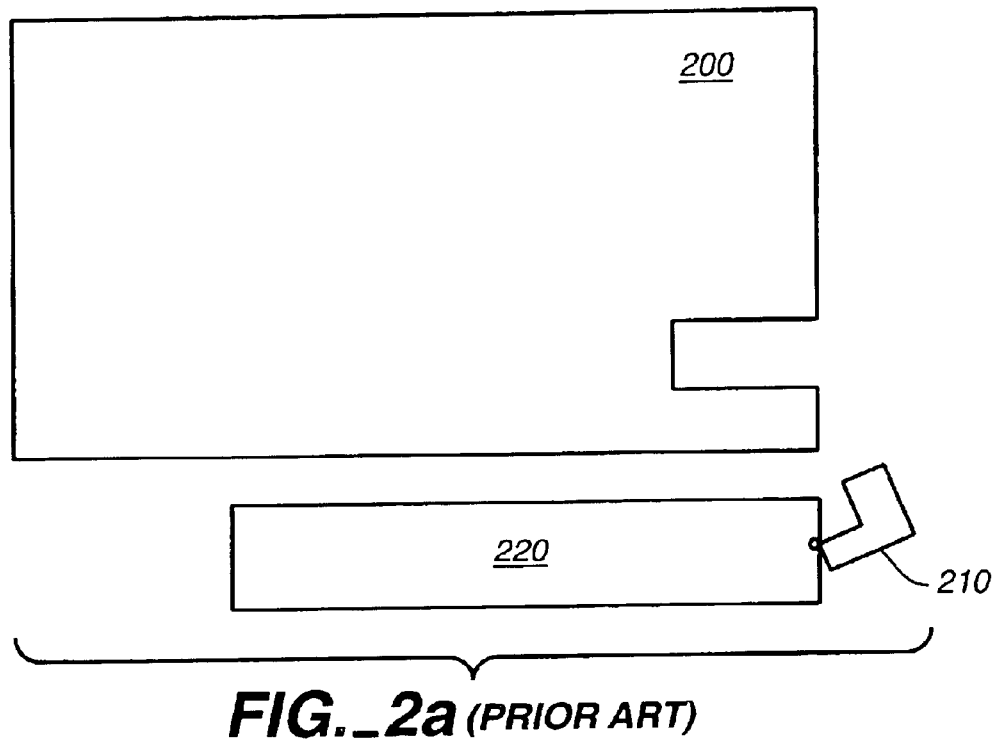
FIG._2a (PRIOR ART)
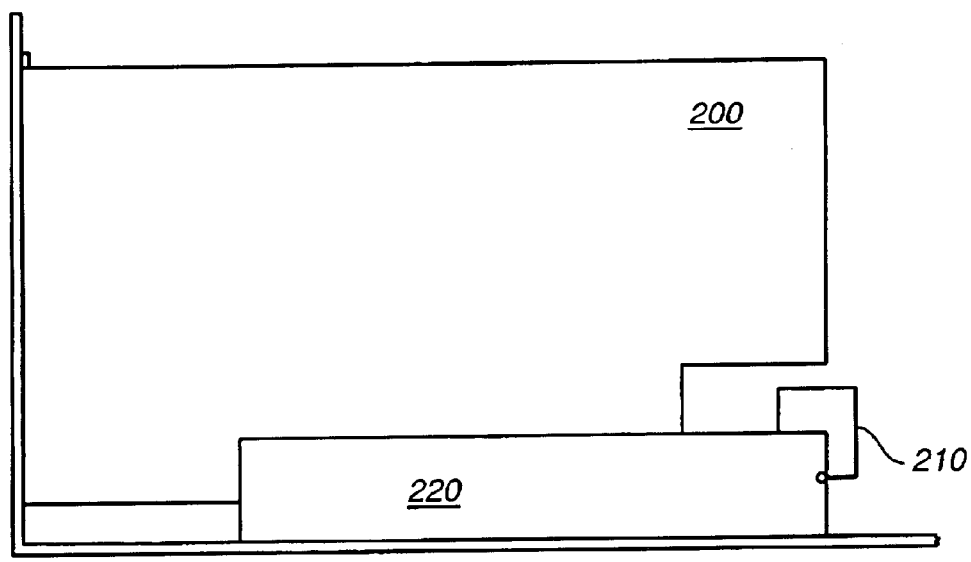
FIG._2b (PRIOR ART)

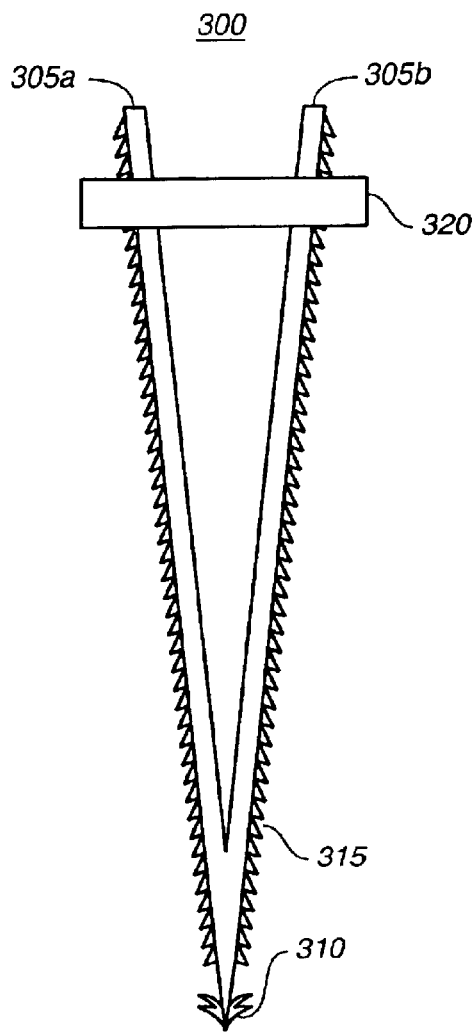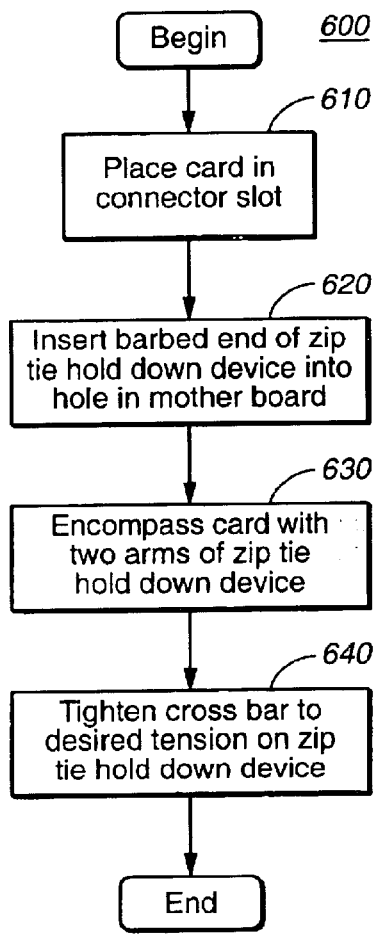
FIG._3      FIG._6

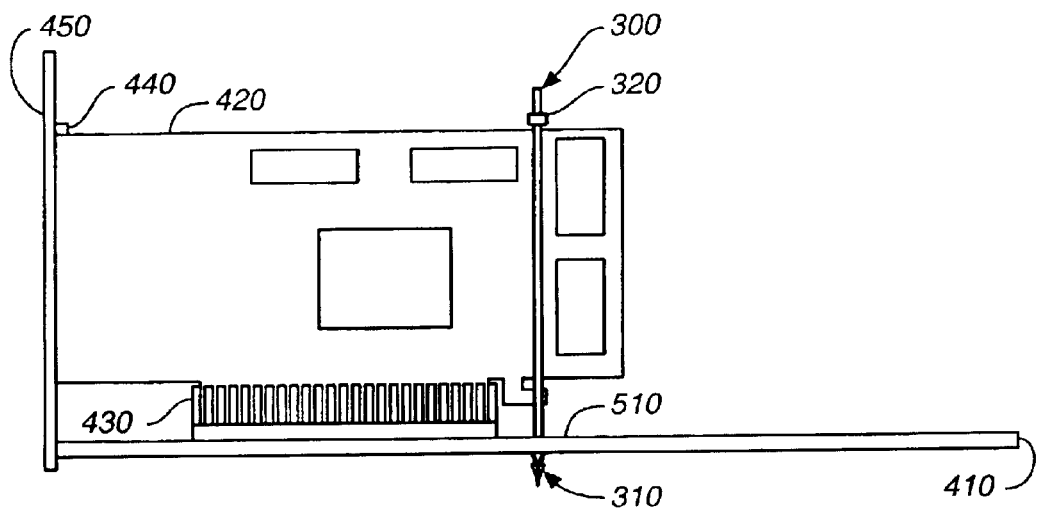
FIG._4
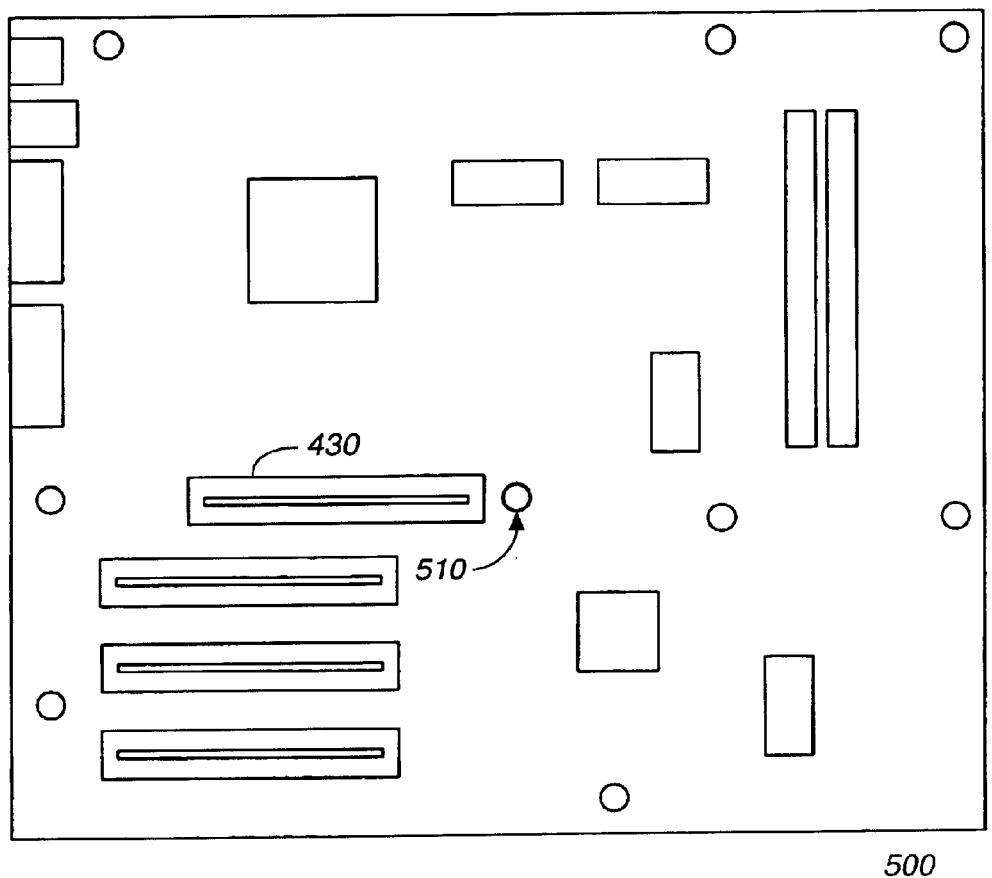
FIG._5

HOLD DOWN APPARATUS FOR PERPENDICULARLY MOUNTED CARDS

TECHNICAL FIELD

Embodiments of the present invention relate to the field of retainers. Specifically, embodiments of the present invention relate to a retention device for perpendicularly mounted cards.

BACKGROUND OF THE INVENTION

Computer video graphics cards, input/output cards and other cards are sometimes mounted perpendicular to a host controller or motherboard that serves to establish electrical connections for circuitry resident on the cards. These connections are established via connectors such as accelerated graphics port (AGP) connectors that contain a slot into which the cards may be inserted.

Cards can fit into a second slot that is perpendicular to the connector and bolted to a chassis. This second slot secures one end of the card, but, if jostled or vibrated, the card may still be rotated out of the connector slot at the opposite end. Because the computer or other electronic device containing the perpendicularly mounted cards may be jostled during transport and use, the cards become susceptible to vibrating and rotating out of the connectors so that their connections may be broken. This can lead to the receipt of computers with malfunctioning video graphics or other functions due to disconnected cards.

Various devices have been designed in an effort to retain the cards in the connectors during jostling and vibrating movement. One such device is shown in Prior Art FIGS. 1a and 1b. This device is a double-arm retention device 100 that connects to AGP connector 105 at point 110 and is secured by a cross bar that may slide down on the top of the card. Device 100 is sometimes prone to becoming disconnected from the connector at point 110 and has thus been somewhat unreliable.

Another conventional device for retaining a card in an AGP connector is illustrated in FIGS. 2a and 2b. Card 200 slides into a slot in connector 220 and latching device 210 is attached to the connector 220 and rotates onto the bottom section of card 200 to capture it. Latching device 210 is sometimes prone to rotating open during transportation, allowing card 200 to rotate out of the slot and become disconnected. Thus latching device 210 is likewise somewhat unreliable.

SUMMARY OF THE INVENTION

A hold down apparatus is disclosed. The hold down apparatus has a saw-toothed device with a divided end and a united end, the divided end adapted to encompass a perpendicularly mounted card. The hold down apparatus has an anchoring hole in a supporting structure to anchor the saw-toothed device and a barbed hook coupled to the saw-toothed device and adapted to anchor the saw-toothed device to the supporting structure through the anchoring hole, wherein the barbed hook deploys from the united end of the saw-toothed device. The hold down apparatus also has a crossbar adapted to couple to the divided end of the device, wherein the crossbar binds the perpendicularly mounted card securely in place.

BRIEF DESCRIPTION OF THE DRAWINGS

Prior Art FIG. 1a depicts a conventional retention device illustrating features that clip over a connector.

Prior Art FIG. 1b illustrates a conventional retention device installed on a perpendicularly mounted circuitry card.

Prior Art FIG. 2a depicts a circuitry card, a connector and a conventional latching device.

Prior Art FIG. 2b illustrates a circuitry card installed with a conventional latching device in place.

FIG. 3 is an illustration of a zip-tie hold down apparatus, according to one embodiment of the present invention.

FIG. 4 depicts an assembled circuitry card retained with a zip-tie hold down apparatus, in accordance with one embodiment of the present invention.

FIG. 5 depicts a motherboard with a hole for receiving a zip-tie hold down apparatus, according to one embodiment of the present invention.

FIG. 6 is a flowchart of the steps in a process for retaining a perpendicularly mounted card in a connector, in accordance with one embodiment of the present invention.

DETAILED DESCRIPTION OF THE INVENTION

Reference will now be made in detail to embodiments of the invention, examples of which are illustrated in the accompanying drawings. While the invention will be described in conjunction with the embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of the present invention, numerous specific details are set forth in order to provide a thorough understanding of the present invention. In other instances, well known methods, procedures, and components have not been described in detail so as not to unnecessarily obscure aspects of the present invention. A device and method for retaining circuitry cards in connector slots is described herein.

Embodiments of the present invention include retention devices that quickly and securely hold down circuitry cards in connector slots, preventing the possible rotation and disconnection problems that may occur with conventional retention devices.

In one embodiment, the hold down apparatus has a saw-toothed device with a double end and a single end, the double end adapted to encompass a perpendicularly mounted card. The hold down apparatus has an anchoring hole in a supporting structure and a barbed hook coupled to the saw-toothed device and adapted to couple the saw-toothed device to the supporting structure through the anchoring hole, wherein the barbed hook deploys from the single end of the saw-toothed device. The hold down apparatus also has a crossbar adapted to couple to the double end of the device, wherein the crossbar binds the perpendicularly mounted card securely in place.

Therefore, the assembly time for installing the device and mounting a card is minimal and the cost of the device is low since it requires no custom tooling and may utilize low cost materials. The hold-down device may eliminate customer frustration that can result from receiving malfunctioning equipment. Such malfunctions have historically been due to a card having vibrated out of its connection in the mounting slot because of the lack of a hold-down device or, as in the case of conventional hold-down device designs, because the devices have become disconnected or rotated open. Elimination of such malfunctions may also reduce costs associated with repairs under warranty.

In one embodiment, a hold down apparatus such as a y-shaped saw-toothed device with a barbed hook can be applied to fastening and/or securing video graphics cards and other perpendicularly mounted circuitry cards via their connectors on a motherboard. However, the present embodiment is not limited to use with circuitry cards and motherboards but rather can be applied to a large number of securing applications. It is appreciated that an embodiment of the present invention can be applied to securing other and different kinds of perpendicularly mounted cards to a variety of support structures.

Certain portions of the detailed descriptions of embodiments of the invention, which follow, are presented in terms of processes and methods (e.g., process 600 of FIG. 6). Although specific steps are disclosed herein describing the operations of these processes and methods, such steps are exemplary. That is, embodiments of the present invention are well suited to performing various other steps or variations of the steps recited in the flowchart of the figure herein.

FIG. 3 is an illustration of zip-tie device 300, according to one embodiment of the present invention. Zip-tie device 300 is a y-shaped device, according to one embodiment, having a divided end comprised of arms 305*a* and 305*b* and a united end 315. The device is made of a non-conductive plastic, nylon or similar material. The arms 305*a* and 305*b* are flat and have saw-toothed edges, according to one embodiment. The saw-toothed edges may be on one side of each of arms 305*a* and 305*b* in one embodiment or on both sides of each of arms 305*a* and 305*b* in another embodiment. Arms 305*a* and 305*b* are approximately the same lengths, which may vary according to the width and/or height of a perpendicularly mounted card that hold down apparatus 200 is intended to secure in place.

Still referring to FIG. 3, united end 315 has saw-toothed edges, according to one embodiment. According to another embodiment united end 315 does not have saw-toothed edges. Deploying from united end 315 is barbed hook 310. Barbed hook 310 may be in the shape of an arrow, according to one embodiment. In another embodiment, barbed end 310 may be mushroom-shaped. In another embodiment, barbed end 310 may be conical. It is appreciated that barbed end 310 may have any shape that would allow it to penetrate a hole in a support structure and not be able to exit the hole, thereby securing device 300 in the support structure.

Crossbar 320 of FIG. 3 has two openings parallel to arms 305*a* and 305*b* that are of a size for accepting saw-toothed arms 305*a* and 305*b* to pass through in one direction only, according to one embodiment. Once crossbar 320 is tightened over an object encompassed by arms 305*a* and 305*b*, the object (e.g., a perpendicularly mounted circuit card or insulating divider) is held securely.

Referring now to FIG. 4, an assembled perpendicularly mounted circuitry card 420, retained with a hold down apparatus 300, is depicted, in accordance with one embodiment of the present invention. Perpendicularly mounted circuitry card 420 slides into a slot in connector 430 and then into slot 440 that is bolted to chassis 450. Connector 430 is bolted to supporting structure 410. For purposes of example, perpendicularly mounted circuitry card 420 is depicted as a video graphics card and connector 430 is depicted as an accelerated graphics port (AGP).

Supporting structure 410 of FIG. 4 is depicted as a motherboard according to one embodiment of the present invention. Barbed hook 310 of device 300 is passed through hole 510 (e.g., hole 510 of FIG. 5) and arms 305*a* and 305*b* of device 300 encompass perpendicularly mounted circuitry card 420. Crossbar 320 is then slipped down over arms 305*a* and 305*b* until card 420 is held securely. Hole 510 is sized so that barbed hook 310 may pass through and not be withdrawn. Although barbed hook 310 is depicted as an arrow according to one embodiment, it should be appreciated that it may have any shape (e.g., mushroom, cone, etc.) that would allow it to pass through hole 510 and would then expand to prevent its being withdrawn. It is understood that the hold down apparatus is well suited to hold down a variety of perpendicularly mounted card-type devices that may be mounted in a slot in or on a variety of supporting structures. For example, the hold down apparatus is well suited to hold an insulating panel, such as an On-Line Replacement (OLX) divider, or other type of panel securely in a perpendicular position in a chassis.

FIG. 5 depicts a motherboard 500 with an anchor hole 510 for receiving a zip-tie device (e.g., device 300), according to one embodiment of the present invention. Hole 510 is drilled in motherboard 500 outboard of connector 430 and is sized to allow a barbed hook (e.g., barbed hook 310 of FIG. 4) to pass through and become captured on the other side of motherboard 500, according to one embodiment.

FIG. 6 is a flowchart of the steps in a process 600 for retaining a perpendicularly mounted card in a connector, in accordance with one embodiment of the present invention. Process 600 begins with step 610 in which a card is placed in a connector slot. In one embodiment the card may be a video graphics card (e.g., video graphics card 420 of FIG. 4) and the slot may be a slot in an AGP connector (e.g., AGP connector 430). In another embodiment the card may be an insulating device such as an OLX divider and the slot may be a slit in a chassis.

At step 620 of flowchart 600 the barbed end of a zip-tie hold down device (e.g., device 300 of FIG. 4) may compress sufficiently to be inserted into a hole (e.g., hole 510 of FIG. 5) in a motherboard (e.g., motherboard 500), according to one embodiment of the present invention. Once inserted through hole 510, barbed end 310 opens and may not be withdrawn and device 300 is captured in motherboard 500. The barbed end may have a variety of shapes, such as an arrow, a double arrow, a cone, a double cone, a mushroom, or any other shape that is compressible so as to fit through an anchor hole and expandable thereafter.

At step 630, card 420 is encompassed with two saw-toothed arms (e.g., saw-toothed arms 305*a* & 305*b* of FIG. 3) of zip-tie hold down apparatus 300, the arms being sufficiently long to reach beyond the card and to contain a crossbar such as crossbar 320 of FIG. 4. When crossbar 320 is moved down arms 305*a* and 305*b*, it may not be moved back up the arms.

At step 640 the crossbar 320 is tightened down on the card sufficiently to prevent it from rotating upward to the extent that it loses electrical connectivity with the slot in AGP connector 430. Thus the connection with connector 43Q and motherboard 410 is maintained in accordance with one embodiment of the present invention, and process 600 is complete.

In summary, a hold down apparatus is disclosed. In one embodiment, the hold down apparatus has a saw-toothed device with a divided end and a united end, the divided end adapted to encompass a perpendicularly mounted card. The hold down apparatus has an anchoring hole in a supporting structure and a barbed hook coupled to the saw-toothed device and adapted to couple the saw-toothed device to the supporting structure through the anchoring hole, wherein the barbed hook deploys from the united end of the saw-toothed device. The hold down apparatus also has a crossbar adapted to couple to the divided end of the device, wherein the crossbar binds the perpendicularly mounted card securely in place.

An embodiment of the present invention, a device and method for retaining perpendicularly mounted cards in connector slots, is thus described. While the present invention has been described in particular embodiments, it should be appreciated that the present invention should not be construed as limited by such embodiments, but rather construed according to the following claims and their equivalents.

What is claimed is:

1. A hold down apparatus comprising:
   a saw-toothed device having a divided end and a united end, said divided end comprising two saw-toothed arms emanating from said united end, said arms adapted to encompass a card, said card mounted perpendicularly to a supporting structure;
   an anchoring hole in said supporting structure to anchor said saw-toothed device;
   a barbed hook coupled to said saw-toothed device and adapted to anchor said saw-toothed device to said supporting structure through said anchoring hole, wherein said barbed hook deploys from said united end of said saw-toothed device; and
   a crossbar adapted to couple to said divided end of said device, wherein said crossbar binds said perpendicularly mounted card securely in place.

2. The hold down apparatus as recited in claim 1, wherein a single edge of each of said saw-toothed arms comprises saw teeth.

3. The hold down apparatus as recited in claim 1, wherein said barbed hook comprises an arrow shape.

4. The hold down apparatus as recited in claim 3, wherein said barbed hook functions to penetrate a hole in said supporting structure, said hole penetrating said supporting structure outboard of a mounting device for mounting said perpendicularly mounted card.

5. The hold down apparatus as recited in claim 1, wherein said supporting structure is a computer motherboard.

6. The hold down apparatus as recited in claim 5, wherein said perpendicularly mounted card is a video graphics card.

7. The hold down apparatus as recited in claim 5, wherein said perpendicularly mounted card is an input/output card.

8. The hold down apparatus as recited in claim 1, wherein said supporting structure is a chassis.

9. The hold down apparatus as recited in claim 8, wherein said perpendicularly mounted card is an insulating divider.

10. A mounting device for securing a perpendicularly mounted card in a mounting slot comprising:
    a saw-toothed device having two saw-toothed arms emanating from a united end, said two saw-toothed arms, each comprising a single edge of saw teeth, adapted to encompass a card, said card mounted perpendicularly to a supporting structure, and a barbed head deploying from said united end;
    an anchoring hole in said supporting structure configured to receive and capture said barbed head, wherein said saw-toothed device becomes anchored to said supporting structure; and
    a crossbar adapted to couple to said two saw-toothed arms of said device, wherein said crossbar binds said perpendicularly mounted card securely in place perpendicular to said supporting structure.

11. The mounting device as recited in claim 10, wherein said barbed head comprises an arrow shape.

12. The mounting device as recited in claim 10, wherein said supporting structure is a computer motherboard.

13. The mounting device as recited in claim 12, wherein said perpendicularly mounted card is a video graphics card.

14. The mounting device as recited in claim 12, wherein said perpendicularly mounted card is an input/output card.

15. The mounting device as recited in claim 10, wherein said supporting structure is a chassis.

16. The mounting device as recited in claim 15, wherein said perpendicularly mounted card is an insulating divider.

17. The mounting device as recited in claim 10, wherein said mounting slot is an Accelerated Graphics Port (AGP) connector.

18. A method of retaining a card in a connector, said card mounted perpendicularly to a support structure and said connector coupled to said support structure, said support structure penetrated by a hole outboard of said connector, comprising:
    placing said card in said connector;
    inserting a barbed head of a zip-tie retention device into said hole in said support structure, wherein said barbed head emanates from a united end of said zip-tie retention device, said zip-tie retention device comprising a united end and a divided end, said divided end comprising two saw-toothed arms;
    encompassing said perpendicularly mounted card with said two arms of said divided end of said zip-tie retention device; and
    sliding a cross bar over said two arms of said zip-tie retention device and tightening said cross bar at said perpendicularly mounted card, said cross bar operable to capture said two arms of said zip-tie retention device.

19. The method as recited in claim 18 wherein said barbed head comprises an arrow shape.

20. The method as recited in claim 18, wherein said support structure is a computer motherboard.

21. The device as recited in claim 20, wherein said perpendicularly mounted card is a video graphics card.

22. The device as recited in claim 18, wherein said support structure is a chassis.

23. The device as recited in claim 22, wherein said perpendicularly mounted card is an insulating divider.

* * * * *